(12) United States Patent
Bai (10) Patent No.: US 12,120,926 B2
(45) Date of Patent: Oct. 15, 2024

(54) DISPLAY PANEL, ARRAY SUBSTRATE, AND METHOD OF MANUFACTURING THEREOF

(71) Applicant: WUHAN CHINA STAR OPTOELECTRONICS SEMICONDUCTOR DISPLAY TECHNOLOGY CO., LTD., Wuhan (CN)

(72) Inventor: Sihang Bai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1112 days.

(21) Appl. No.: 16/966,094

(22) PCT Filed: Mar. 16, 2020

(86) PCT No.: PCT/CN2020/079475
§ 371 (c)(1),
(2) Date: Jul. 30, 2020

(87) PCT Pub. No.: WO2021/168924
PCT Pub. Date: Sep. 2, 2021

(65) Prior Publication Data
US 2023/0180539 A1  Jun. 8, 2023

(30) Foreign Application Priority Data

Feb. 25, 2020 (CN) .......................... 202010115667.1

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 77/111* (2023.02); *H10K 2102/311* (2023.02)

(58) Field of Classification Search
CPC ... H10K 59/124; H10K 77/111; H10K 59/131
See application file for complete search history.

(56) References Cited

U.S. PATENT DOCUMENTS

| 11,283,055 B2* | 3/2022 | An ......................... H10K 50/87 |
| 2017/0237025 A1* | 8/2017 | Choi ..................... H10K 50/80 257/40 |
| 2018/0040638 A1* | 2/2018 | Wu ..................... H01L 27/1218 |

FOREIGN PATENT DOCUMENTS

| CN | 108550612 A | 9/2018 |
| CN | 109300399 A | 2/2019 |

* cited by examiner

*Primary Examiner* — Michele Fan
(74) *Attorney, Agent, or Firm* — PV IP PC; Wei Te Chung (57) ABSTRACT

A display panel, an array substrate, and a method of manufacturing thereof are provided, and the method includes: forming a semiconductor material layer, a barrier component, a first insulating layer, a gate, a second insulating layer, and an interlayer dielectric layer on the array substrate in order, performing a photolithographic process on the first insulating layer, gate, second insulating layer, and interlayer dielectric layer with a predetermined mask, forming a first via hole, a second via hole, and a groove; forming a source, drain, metal component and; and forming a planarization layer.

15 Claims, 6 Drawing Sheets

(51) Int. Cl.
*H10K 77/10* (2023.01)
*H10K 102/00* (2023.01)

DISPLAY PANEL, ARRAY SUBSTRATE, AND METHOD OF MANUFACTURING THEREOF

FIELD OF INVENTION

The present disclosure relates to the field of display technology, and more particularly, to a display panel, an array substrate, and a method of manufacturing thereof.

DESCRIPTION OF PRIOR ART

Active matrix organic light emitting diode (AMOLED) display panels have become an outstanding representative of next-generation display technology due to their thin thickness, flexibility, and wearability. Currently, one of the most commonly used methods to improve bending performance at the bending area of the AMOLED display panel is applying a multi-step etching method to remove the inorganic film layer at the bending area of the array substrate in the AMOLED display panel, replacing it with an organic thin-film with less stress, to improve the bending performance of the AMOLED display panels.

However, the above-mentioned method of manufacturing the AMOLED requires 11 masking steps, and the technical process is complex and has low production efficiency.

Therefore, it is necessary to propose a new technical solution to solve the above technical issue.

SUMMARY OF INVENTION

A display panel, an array substrate, and a method of manufacturing thereof are provided, so as to solve the technical problems which requires many masking procedures during the manufacturing of the array substrate in the display panel.

In one embodiment, a method of manufacturing an array substrate comprises:
  step A: forming a semiconductor component, a barrier component, a first insulating layer, a gate, a second insulating layer, and an interlayer dielectric layer on the array substrate in order;
  step B: performing a photolithographic process on the first insulating layer, the gate, second insulating layer, and the interlayer dielectric layer with a predetermined mask; forming a first via hole, a second via hole, and a groove on the first insulating layer, the gate, the second insulating layer, and the interlayer dielectric layer by etching, wherein the first via hole and the second via hole are formed in a display area of the array substrate, the groove is formed in a bending area of the substrate, the barrier component are formed in a bending area of the array substrate, and the barrier component and the semiconductor component or the gate are formed on a same level layer;
  step C: forming a metal layer in the first via hole, the second via hole, and the groove, wherein a source, a drain, and a metal component are formed by the metal layer; and
  step D: forming a planarization layer, wherein the planarization layer is disposed on the interlayer dielectric layer and covers the groove.

In one embodiment, the barrier component is formed during forming the semiconductor component or the gate.

In one embodiment, the step A comprises:
  forming a semiconductor material layer on the substrate;
  patterning the semiconductor material layer to form the semiconductor component and the barrier component; and
  forming the first insulating layer, the gate, the second insulating layer, and the interlayer dielectric layer on the semiconductor component in order.

In one embodiment, a thickness of the barrier component before etching is equal or similar to the thickness of the semiconductor component, and a thickness of the barrier component after etching is less than a thickness of the semiconductor component.

In one embodiment, the step A comprises:
  forming the semiconductor component on the substrate;
  forming the first insulating layer on the semiconductor component;
  forming a metal material layer on the first insulating layer;
  patterning the metal material layer to form the gate and the barrier component; and
  forming the second insulating layer and the interlayer dielectric layer on the gate.

In one embodiment, a thickness of the barrier component before etching is equal or similar to a thickness of the gate, and a thickness of the barrier component after etching is less than a thickness of the gate.

In one embodiment, the groove comprises a first groove and an opening of a second groove formed at a bottom of the first groove, and the barrier component is formed at a bottom of the first groove and an outside of the opening of the second groove;
  wherein the step B comprises:
  performing a first photolithographic process and an etching on the substrate, the semiconductor component, the first insulating layer, the gate, the second insulating layer, and a portion of the interlayer dielectric layer corresponding to the bending area to form the first groove through the predetermined mask; and
  performing a second photolithographic process and an etching on the substrate, the semiconductor component, the first insulating layer, the gate, the second insulating layer, and a portion of the interlayer dielectric layer corresponding to the first groove to form the second groove through the predetermined mask and the barrier component.

In one embodiment, at least a portion of the metal component covers a sidewall of the first groove, the barrier component, and a sidewall and a bottom of the second groove.

An array substrate comprises:
  a substrate;
  a semiconductor component, wherein the semiconductor component is formed on the substrate;
  a first insulating layer, wherein the first insulating layer covers the semiconductor component;
  a gate, wherein the gate is formed on the first insulating layer;
  a second insulating layer, wherein the second insulating layer covers the gate;
  an interlayer dielectric layer, wherein the interlayer dielectric layer covers the second insulating layer;
  a source, wherein at least a portion of the source is filled into a first via hole, and the source is electrically connected to the semiconductor component;
  a drain, wherein at least a portion of the drain is filled into a second via hole, and the drain is electrically connected to the semiconductor component;

a barrier component, wherein the barrier component and the semiconductor component or the gate are formed on a same level layer;

a metal component, wherein at least a portion of the metal component is filled into a groove; and a planarization layer, wherein the planarization layer is disposed on the interlayer dielectric layer and covers the groove; and wherein the first via hole and the second via hole are formed in a display area of the array substrate, a bottom of the first via hole and a bottom of the second via hole are connected to the semiconductor component, the groove is formed in the bending area of the array substrate, and the barrier component is formed in the bending area.

In one embodiment, the barrier component is formed during forming the semiconductor component or the gate.

In one embodiment, a thickness of the barrier component before etching is equal or similar to a thickness of the semiconductor component or the gate, and a thickness of the barrier component after etching is less than a thickness of the semiconductor component or the gate.

In one embodiment, the grooves comprise a first groove and an opening of a second groove formed at a bottom of the first groove, and the barrier component is formed at a bottom of the first groove and an outside of the opening of the second groove.

In one embodiment, at least a portion of the metal component covers a sidewall of the first groove, the barrier component, and a sidewall and a bottom of the second groove.

In one embodiment, the substrate comprises a first flexible substrate, a silicon dioxide layer, a second flexible substrate, a barrier layer, and a buffer layer.

A display panel comprises: an array substrate, a pixel definition layer, an anode, an organic light emitting layer, a cathode, and a packaging layer, wherein the array substrate comprises:
  a substrate;
  a semiconductor component, wherein the semiconductor component is formed on the substrate;
  a first insulating layer, wherein the first insulating layer covers the semiconductor;
  a gate, wherein the gate is formed on the first insulating layer;
  a second insulating layer, wherein the second insulating layer covers the gate;
  an interlayer dielectric layer, wherein the interlayer dielectric layer covers the second insulating layer;
  a source, wherein at least a portion of the source is filled into a first via hole, and the source is electrically connected to the semiconductor component;
  a drain, wherein at least a portion of the drain is filled into a second via hole, and the drain is electrically connected to the semiconductor component;
  a barrier component, wherein the barrier component and the semiconductor component or the gate are formed on a same level layer;
  a metal component, wherein at least a portion of the metal component is filled into a groove; and
  a planarization layer, wherein the planarization layer is disposed on the interlayer dielectric layer and covers the groove, and the pixel definition layer, the anode, the organic light emitting layer, the cathode, and the packaging layer are formed on the planarization layer in order; and wherein the first via hole and the second via hole are formed in the display area of the array substrate, a bottom of the first via hole and a bottom of the second via hole are connected to the semiconductor component, the groove is formed in the bending area of the array substrate, and the barrier component is formed in the bending area.

In one embodiment, the barrier component is formed during forming the semiconductor component or the gate.

In one embodiment, a thickness of the barrier component before etching is equal or similar to a thickness of the semiconductor component or the gate, and a thickness of the barrier component after etching is less than a thickness of the semiconductor component or the gate.

In one embodiment, the grooves comprise a first groove and an opening of a second groove formed at a bottom of the first groove, and the barrier component is formed at a bottom of the first groove and an outside of the opening of the second groove.

In one embodiment, at least a portion of the metal component covers a sidewall of the first groove, the barrier component, and a sidewall and a bottom of the second groove.

As compared to the current available technology, the present invention for manufacturing a display panel and array substrate has reduced the procedures for masking and improved the production efficiency by masking a first insulating layer, a gate, a second insulating layer, an interlayer dielectric layer with a predetermined mask. The four masking processes required to prepare a first via whole, a second via hole, a first groove, and a second groove independently have combined into one.

Besides, the barrier layer is formed by using the semiconductor and barrier component on the same level layer or by using the gate and barrier component on the same level layer to realize the bending area in the step design.

At the same time, the source/drain (SD) traces are directly crossed in the deep hole (DH) area, eliminating the requirement for an organic deep hole (ODH) masking, which brings the SD traces closer to the flexible substrate, making SD be served as a neutral plane, thereby improving the bending performance of the array substrate in the display panel.

The present invention solves the technical problems of complicated array substrate manufacturing processes, low productivity, and an excessively large distance between SD and the flexible substrate in the display panel of the prior art, which is not conducive to the bending issues in the bending region.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

DETAILED DESCRIPTION OF PREFERRED EMBODIMENTS

Referring to the brief description of drawings and the component number is corresponding to the component, and the following description is based on a specific embodiment used in the present invention, which should not be considered as limiting other embodiments of the invention that are not described in detailed herein. The term "embodiment" used in this specification means an example, an instance, or an illustration. Besides that, the articles "a" and "an" used in this specification and the section what is claimed is can be understood as "one or more than one" unless specified or can be defined from the context.

Figure 1:
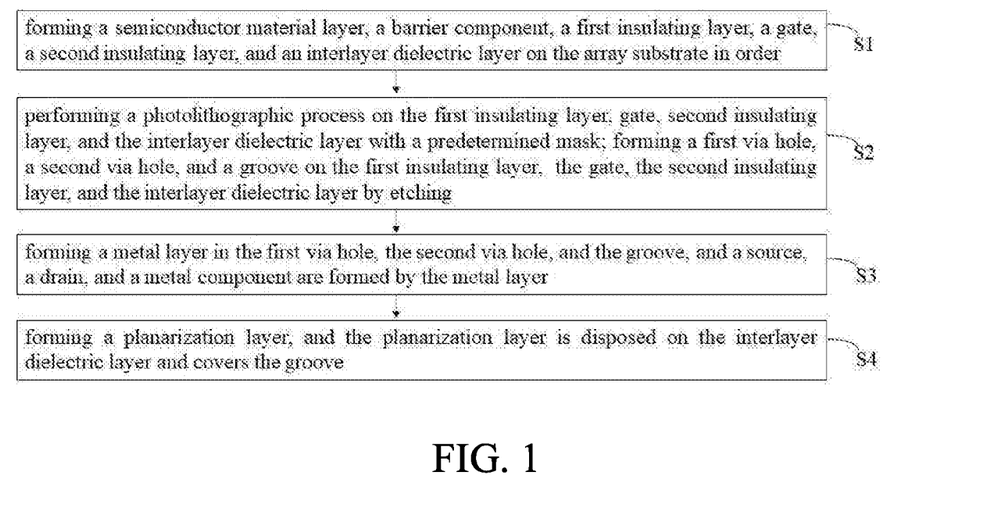
FIG. 1 is a flowchart of a manufacturing method for an array substrate according to one embodiment of the present invention.

Referring to FIG. 1, a method of manufacturing an array substrate is provided, and the method comprises steps as follows:

step S1: forming a semiconductor material layer, a barrier component, a first insulating layer, a gate, a second insulating layer, and an interlayer dielectric layer on the array substrate in order;

step S2: performing a photolithographic process on the first insulating layer, gate, second insulating layer, and the interlayer dielectric layer with a predetermined mask; forming a first via hole, a second via hole, and a groove on the first insulating layer, the gate, the second insulating layer, and the interlayer dielectric layer by etching;

step S3: forming a metal layer in the first via hole, the second via hole, and the groove, and a source, a drain, and a metal component are formed by the metal layer; and step S4: forming a planarization layer, and the planarization layer is disposed on the interlayer dielectric layer and covers the groove.

Figure 2:
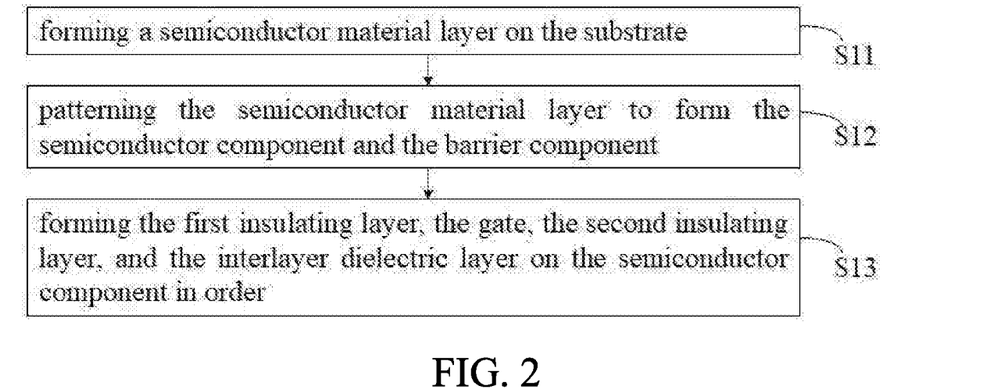
FIG. 2 is a flowchart of the manufacturing method for the array substrate to complete procedure in step S1 according to one embodiment of the present invention.
Figure 4:
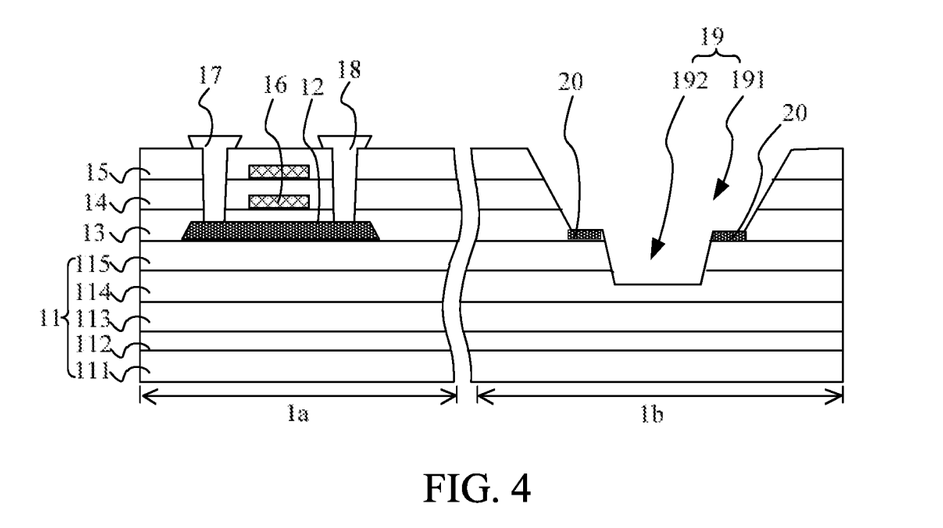
FIG. 4 is a schematic structural diagram of the manufacturing method for the array substrate to complete procedure in step S2 according to one embodiment of the present invention.

Referring to FIG. 2 and FIG. 4, step S1 comprises:

step S11: forming a semiconductor material layer on the substrate 11;

step S12: patterning the semiconductor material layer to form the semiconductor component 12 and the barrier component 20; and step S13: forming the first insulating layer 13, the gate 16, the second insulating layer 14, and the interlayer dielectric layer 15 on the semiconductor component 12 in order.

Specifically, in the step S11, referring to FIG. 4, a chemical vapor deposition (CVD) is performed to form a first flexible substrate 111 on a glass substrate; the first flexible substrate 111 is composed of polyimide (PI), polyethylene dicarboxylate (PET), polyethylene naphthalate (PEN), polycarbonate (PC), polyethersulfone (PES), fluorotoluene containing polyarylate (PAR), polycyclic olefin (PCO), etc., and then the chemical vapor deposition is performed to form a silicon dioxide layer 112, a second flexible substrate 113, a barrier layer 114, and a buffer layer 115 in order, and the second flexible substrate 113 and the first flexible substrate 111 are composed of the same materials like polyimide (PI), polyethylene dicarboxylate (PET), polyethylene naphthalate (PEN), polycarbonate (PC), polyethersulfone (PES), fluorotoluene containing polyarylate (PAR), polycyclic olefin (PCO), etc. The buffer layer 115 is composed of one or two of SiNx or $SiO_2$. Then, a semiconductor material layer is formed on the substrate 11.

In the step S12, performs a patterning process on the semiconductor material layer via a half-tone photomask, a photoresist layer is coated on the semiconductor material layer, exposure and development are performed by using a mask, and then the semiconductor material layer is etched to remove the photoresist layer, and thus a semiconductor component 12 and a first barrier component 20 are formed, and the semiconductor component 12 and the first barrier 20 are located on a same level layer.

In the step S13, the first insulating layer 13, the gate 16, the second insulating layer 14, and the interlayer dielectric layer 15 are formed on the semiconductor component 12 in order.

Next, a photoresist is coated on interlayer dielectric layer 15 to form a photoresist layer by using the first barrier component 20 as a barrier layer, a patterning process is performed via a half-tone photomask, exposure and development are performed by using a mask, and the photoresist layer is removed via an ashing process, and then a first via hole 17, a second via hole 18, and a groove 19 are formed by etching, and the first via hole 17 and second via hole 18 are formed in the display area 1a of the array substrate, and the groove 19 is formed in the bending area 1b of the array substrate.

The width of the first via hole 17 and the second via hole 18 are the same. The width ranges from 2 micrometers to 4 micrometers, and the width of the first barrier component 20 ranges from 10 micrometers to 20 micrometers.

The thickness of the first barrier component before etching is the same or similar to the thickness of the semiconductor, and the thickness of the first barrier component 20 after etching is less than the thickness of the semiconductor component 12, avoiding using the first barrier component 20 as a barrier layer, which will lead to completely etched during the formation of the second groove; the thickness of the semiconductor component 12 is greater than a first predetermined value, and the first predetermined value is 30 nanometers, and preferably the thickness of the semiconductor component 12 ranges from 30 nanometers to 1000 nanometers; the thickness of the first barrier component 20 after etching is greater than a second predetermined value, and the second predetermined value is 15 nanometers, and preferably, the thickness of the first barrier component 20 after etching is in between 15 nanometers to 900 nanometers.

Figure 3:
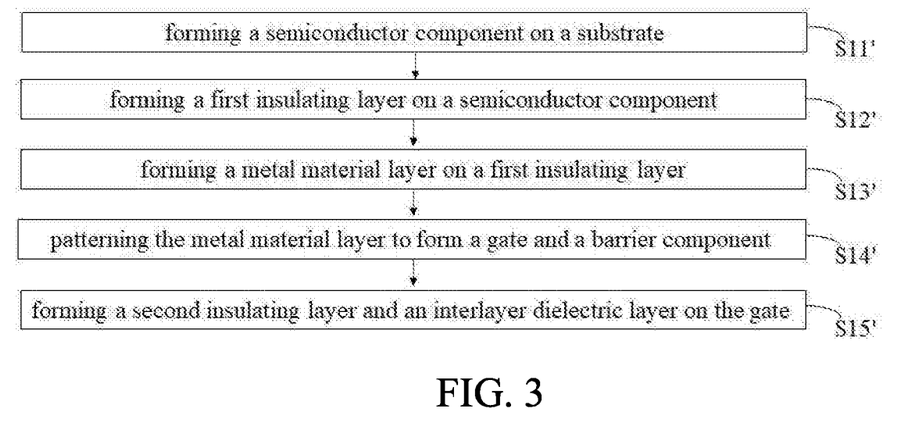
FIG. 3 is a flowchart of the manufacturing method for the array substrate to complete procedure in step S1 according to another embodiment of the present invention.
Figure 5:
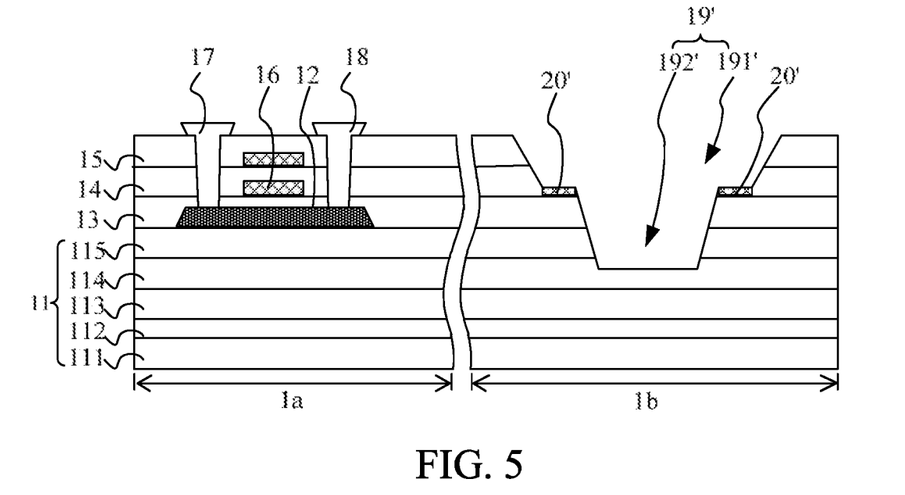
FIG. 5 is a schematic structural diagram of the manufacturing method for the array substrate to complete procedure in step S2 according to another embodiment of the present invention.

Optionally, referring to the FIG. 3 and FIG. 5, in the method of manufacturing the array substrate, step S1 comprises:

step 11': forming a semiconductor component 12 on a substrate 11;
step 12': forming a first insulating layer 13 on a semiconductor component 12;
step 13': forming a metal material layer on a first insulating layer;
step 14': patterning the metal material layer to form a gate 16 and a barrier component 20'; and
step 15': forming a second insulating layer 14 and an interlayer dielectric layer 15 on the gate 16.

Specifically, in the step S11', a semiconductor material layer is formed on the substrate 11, and an patterning process is performed on the semiconductor material layer via a half-tone photomask, a photoresist layer is coated on the semiconductor material layer, exposure and development are performed by using a mask, and then the semiconductor material layer is etched to remove the photoresist layer to form a semiconductor component 12. The manufacturing process of the substrate 11 is the same with step 11, and the details will not be described herein again.

In the step S12', referring to the FIG. 5, a semiconductor component 12 is formed on a first insulating layer 13.

In the step S13', a metal layer is formed on the first insulating layer 13.

In the step S14', a photoresist layer is coated on the semiconductor material layer, exposure and development are performed by using a mask, and then the semiconductor material layer is etched to remove the photoresist layer. A gate 16 and a second barrier component 20' are formed. The gate 16 and the second barrier component 20' are formed on the same level layer.

In the step S15', a second insulating layer 14 and an interlayer dielectric layer are formed on the gate 16.

Next, a photoresist is coated on interlayer dielectric layer 15 to form a photoresist layer by using the second barrier component 20' as a barrier layer, a patterning process is performed via half-tone photomask, exposure and development are performed by using a mask, the photoresist layer is removed via an ashing process, and then a first via hole 17, a second via hole 18, and a groove 19 are formed by etching. The first via hole 17 and second via hole 18 are formed in the display area 1a of the array substrate, and the groove 19 is formed in the bending area 1b of the array substrate.

The width of the second barrier component 20' ranges from 10 micrometers to 20 micrometers.

The thickness of the second barrier component before etching is the same or similar to the thickness of the gate 16, and the thickness of the second barrier component 20' after etching is less than the thickness of the gate 16, avoiding using the second barrier component 20' as a barrier layer, which will lead to completely etched during the formation of the second groove; the thickness of the gate 16 is greater than a third predetermined value, where the third predetermined value is 50 nanometers, and preferably, the thickness of the semiconductor component ranges from 50 nanometers to 2000 nanometers; the thickness of the second barrier component 20' after etching is greater than a forth predetermined value, and the forth predetermined value is 30 nanometers, and preferably, the thickness of the second barrier component 20' after etching is in between 30 nanometers to 1800 nanometers.

In one embodiment, the first barrier component 20 or the second barrier component 20' is used as a barrier layer. The first via hole 17, second via hole 18, and groove 19 are formed in one step via masking, which reduces masking steps, and four masking steps are changed into one step, thereby saving the production time and the production cost.

It should be noted that, in one embodiment, the barrier components are located on a different level layer, therefore the barrier component located on the same level layer with the semiconductor component 12 is referred as a first barrier component 20, and the barrier component located on the same level layer with the gate 16 is referred as a second barrier component.

Figure 6:
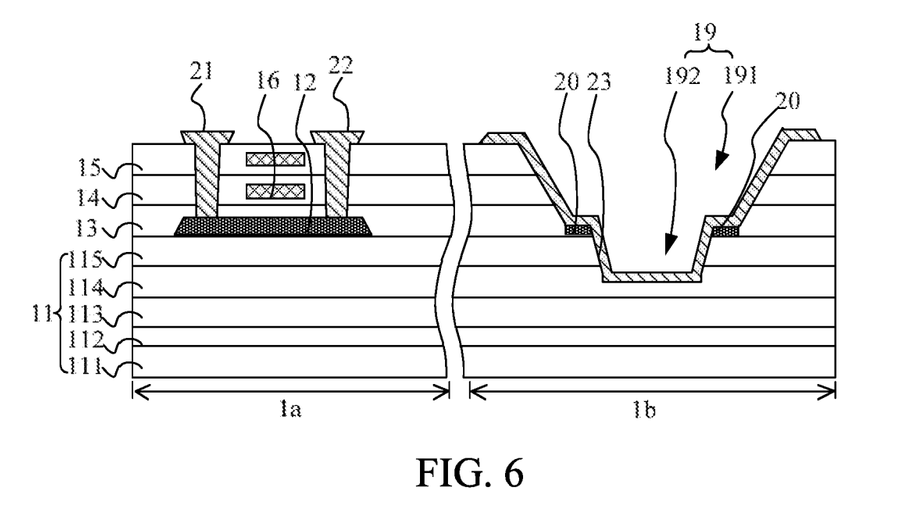
FIG. 6 is a schematic structural diagram of the manufacturing method for the array substrate to complete procedure in step S3 according to one embodiment of the present invention.

In the step S3, referring to FIG. 4 and FIG. 6, the first barrier component 20 is used as a barrier layer. A metal layer is formed in the first via hole 17, the second via hole 18, and the groove 19 so as to form a source 21, a drain 22, and a metal component 23. The source 21, drain 22, and metal component 23 are made of the same materials, which are combination of stacked structure composed of titanium, aluminium, and titanium, and the materials for fabricating the source 21, the drain 22, and the metal component 23 may be one or more stacked structures of molybdenum, titanium, aluminium, and copper.

Figure 7:
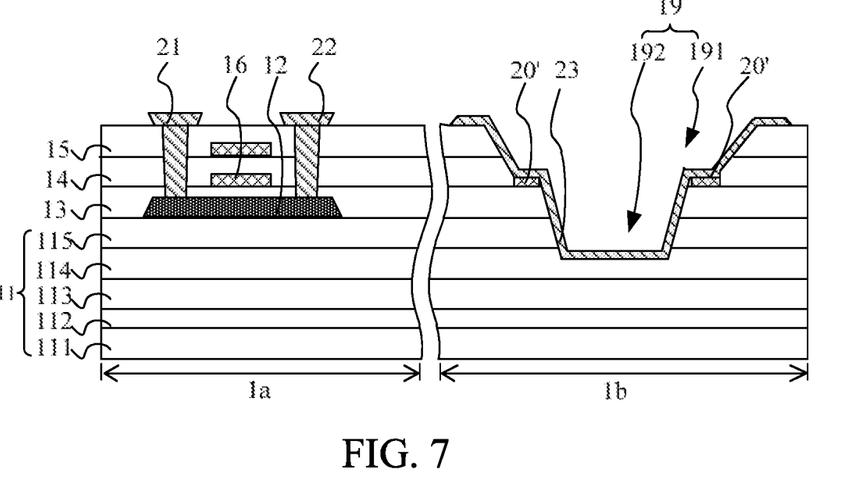
FIG. 7 is a schematic structural diagram of the manufacturing method for the array substrate to complete procedure in step S3 according to another embodiment of the present invention.

Optionally, in one embodiment, referring to the FIG. 5 and FIG. 7, the second barrier component 20' is used as a barrier layer. A metal layer is formed in the first via hole 17, second via hole 18, and groove 19 so as to form the source 21, the drain 22, and the metal component 23. The source 21, the drain 22, and the metal component 23 are made of the same materials, which are combination of stacked structure composed of titanium, aluminium, and titanium. Also, the source 21, drain 22 and metal component 23 may be made of one or more than one stacked structures of molybdenum, titanium, aluminium, and copper.

Figure 8:
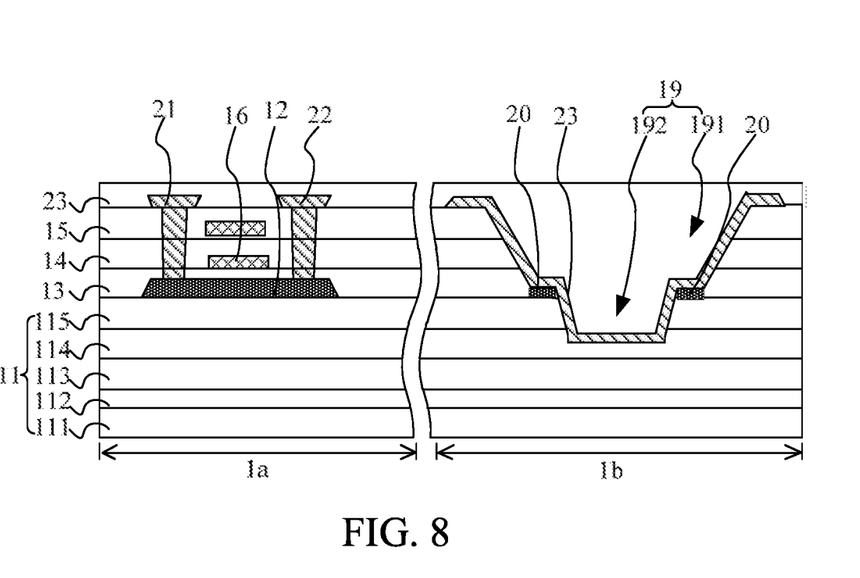
FIG. 8 is a schematic structural diagram of the array substrate according to one embodiment of the present invention.
Figure 9:
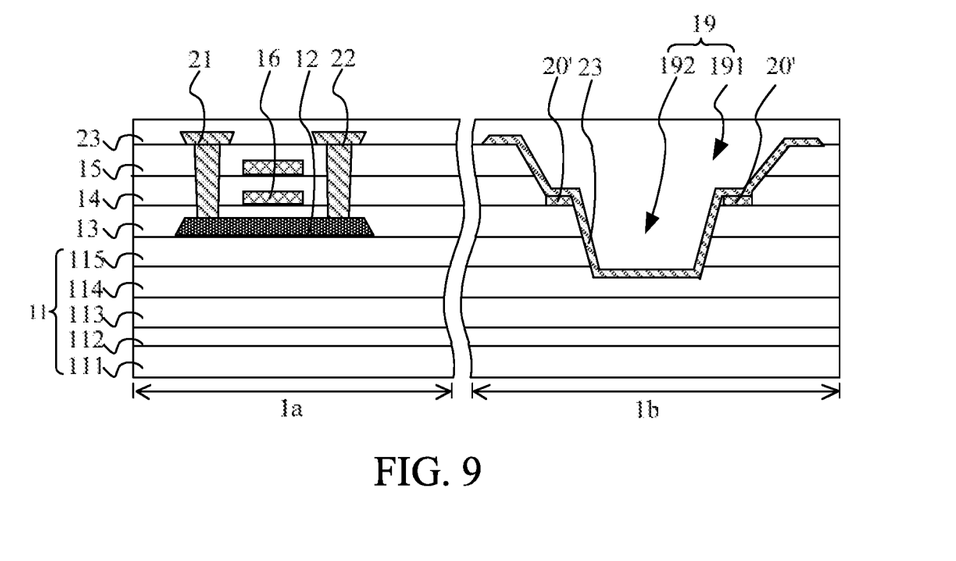
FIG. 9 is schematic structural diagram of the array substrate according to another embodiment of the present invention.

In the step S4, referring to FIG. 8 and FIG. 9, a planarization layer 24 is formed. The planarization layer 24 is formed on the interlayer dielectric layer 16 and covers the groove 19. The organic material of the planarization layer 24 is filled into the entire groove 19, and the distance between the metal trace 23 and the flexible substrate is made closer, so that the source and the drain are served as a neutral plane, thereby realizing a better bending characteristic. In the method of manufacturing an array substrate according to one embodiment the present invention, a first photolithographic process is performed on the substrate 11, semiconductor component 12, the first insulating layer 13, the gate 16, the second insulating layer 14, the interlayer dielectric layer 15, and a portion corresponding to the bending area 1b by using a predetermined mask, and then performing an etching process to form a first groove 191. A second photolithographic process is performed on the substrate 11, semiconductor component 12, first insulating layer 13, the gate 16, the second insulating layer 14, the interlayer dielectric layer 15, and a portion corresponding to the first groove 191 by using a predetermined mask and the first barrier component 20, and then performing an etching process to form a second groove 192. At least a portion of the metal component 23 covers the sidewall of the first groove 191, first barrier component 20, and the sidewall and the bottom of the second groove 192.

Optionally, the second photolithographic process is performed on the substrate 11, the semiconductor component 12, the first insulating layer 13, the gate 16, the second insulating layer 14, the interlayer dielectric layer 15, and a portion corresponding to the first groove by using a predetermined mask and the second barrier component 20', and then performing an etching process to form a second groove. At least a portion of the metal component 23 covers the sidewall of the first groove 191, the first barrier component 20', and the sidewall and the bottom of the second groove 192.

As shown in the figures, in one embodiment, an array substrate comprises a substrate 11, a semiconductor component 12, a first insulating layer 13, a gate 16, second insulating layer 14, an interlayer dielectric layer 15, a source 21, a drain 22, a barrier component, and a metal component 23 described as follows.

A substrate 11 comprises a first flexible substrate 111, a silicon dioxide layer 112, a second flexible substrate 113, a barrier layer 114, and a buffer layer 115. The first flexible substrate 111 is composed of polyimide (PI), polyethylene dicarboxylate (PET), polyethylene naphthalate (PEN), polycarbonate PC, polyether sulfone (PES), fluorotoluene containing polyarylate (PAR), polycyclic olefin (PCO), etc.

A semiconductor component 12 is formed on the substrate 11. The semiconductor component 12 is covered by the first insulating layer 13. The gate 16 is disposed on the first insulating layer 13. The gate 16 is covered by the second insulating layer 14. The second insulating layer 14 is covered by interlayer dielectric layer 15.

At least a portion of the source 21 is filled into a first via hole 17. The source 21 is electrically connected to the semiconductor component 12. At least a portion of the drain 22 is filled into a second via hole 18. The drain 22 is electrically connected to the semiconductor component 12.

A barrier component is formed on a same level layer with the semiconductor component or the gate. When the barrier component is formed on the same level layer with the semiconductor component 12, it is referred as the first barrier component 20, when the barrier component is formed on the same level layer with the gate 16, it is referred as the second barrier component 20'.

At least a portion of the metal component 23 is filled into the groove 19; and the array substrate further comprises a planarization layer 24.

The width of a first via hole 17 and the second via hole 18 are the same, the width ranges from 2 micrometers to 4 micrometers, and the width of the first barrier component 20 ranges 10 micrometers and 20 micrometers The thickness of the first barrier component before etching is the same or similar to the thickness of the semiconductor, and the thickness of the first barrier component 20 after etching is less than the thickness of the semiconductor component 12, avoiding using the first barrier component 20 as a barrier layer, which will lead to completely etched during the formation of the second groove; the thickness of the semiconductor component 12 is greater than a first predetermined value, where the first predetermined value is 30 nanometers, and preferably, the thickness of the semiconductor component 12 ranges from 30 nanometers to 1000 nanometers; the thickness of the first barrier component 20 after etching is greater than a second predetermined value, and the second predetermined value is 15 nanometers, and preferably, the thickness of the first barrier component 20 after etching ranges from 15 nanometers to 900 nanometers. The width of the second barrier component 20' ranges from 10 micrometers to 20 micrometers.

The thickness of the second barrier component before etching is the same or similar to the thickness of the gate 16, and the thickness of the second barrier component 20' after etching is less than the thickness of the gate 16, avoiding using the second barrier component 20' as a barrier layer, which will lead to completely etched during the formation of the second groove; the thickness of the gate 16 is greater than a third predetermined value, and the third predetermined value is 50 nanometers, and preferably, the thickness of the semiconductor component ranges from 50 nanometers to 2000 nanometers; the thickness of the second barrier component 20' after etching is greater than a forth predetermined value, and the forth predetermined value is 30 nanometers, and preferably, the thickness of the second barrier component 20' after etching ranges from 30 nanometers to 1800 nanometers.

A photolithographic process is performed on the first insulating layer 13, the gate 16, the second insulating layer 14, and the interlayer dielectric layer 15 by using a predetermined mask and the barrier component 20. Then, the first via hole 17, the second via hole 18, and the groove 19 are formed by an etching process. The first via hole 17 and the second via hole 18 are formed in the display area 1a in the array substrate. The semiconductor component 12 is connected to the bottoms of the first via hole 17 and second via hole 18. The groove 19 is formed in the bending area 1b of the array substrate. The barrier component 20 is formed in the bending area 1b. The barrier component is formed on the same level layer with the semiconductor component 12 or the gate 16. The first barrier component 20 is formed on the semiconductor component 12, and the second barrier component 20' is formed on the gate 16. The first barrier component 20 is formed during the formation of semiconductor component 12.

Furthermore, the groove 19 comprises a first groove 191 and a second groove 192. An opening of the second groove 192 is formed at a bottom of the first groove 191. The first barrier component 20 is formed at the bottom of the first groove 191 and an outside of the opening of the second groove 192.

Optionally, the second barrier 20' is formed at the bottom of the first groove 191 and an outside opening of the second groove 192.

Furthermore, in one embodiment, at least a portion of the metal component 23 covers the sidewall of the first groove 191, the first barrier component 20, and the sidewall and bottom of the second groove 192.

Optionally, at least a portion of the metal component 23 covers the sidewall of first groove 191, second barrier component 20', and the sidewall and bottom of the second groove 192.

Figure 10:
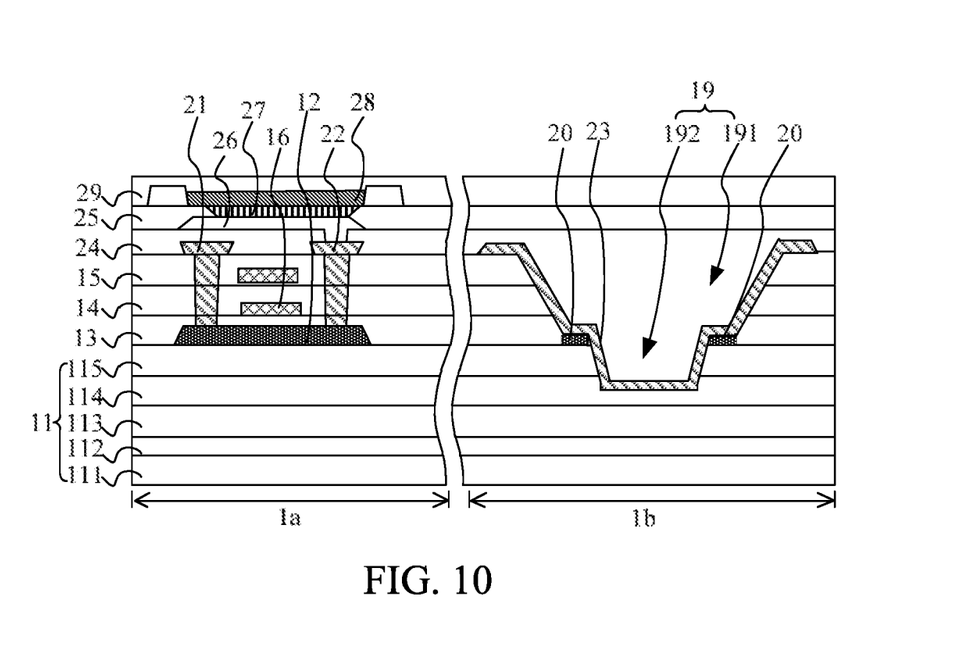
FIG. 10 is a schematic structural diagram of the display panel according to one embodiment of the present invention.
Figure 11:
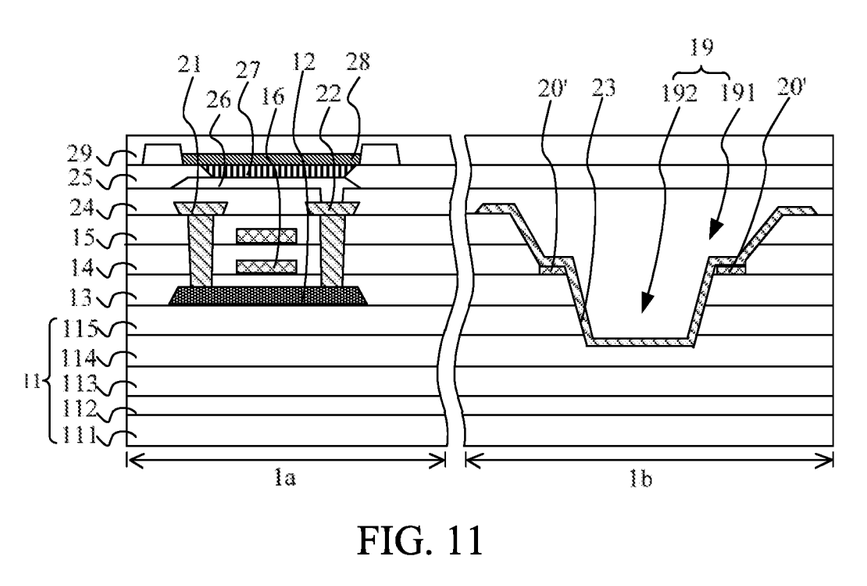
FIG. 11 is another schematic structural diagram of the display panel according to another embodiment of the present invention.

Referring to FIG. 10 and FIG. 11, a display panel comprises the above-mentioned array substrate, a pixel definition layer 25, an anode 26, an organic light emitting layer 27, a cathode 28, and a packaging layer 29. The pixel definition layer 25, the anode 26, the organic light emitting layer 27, the cathode 28, and the packaging layer 29 are sequentially stacked on the planarization layer 24.

Comparing to the current technology for manufacturing an array substrate, a display panel, an array substrate, and a method of manufacturing thereof are provided. The first via hole, the second via hole, the first groove, and the second groove are formed in one step via a photomask process. The barrier layer formed on the same level layer with the semiconductor component or the barrier layer formed on the same level layer with the gate may be used as the barrier layer in the display panel, thereby realizing the bending area in the step design.

At the same time, the source/drain (SD) traces are directly crossed in the deep hole (DH) area, eliminating the requirement for an organic deep hole (ODH) masking, which brings the SD traces closer to the flexible substrate, making SD be served as a neutral plane, thereby improving the bending performance of the array substrate in the display panel.

The present invention solves the technical problems of complicated array substrate manufacturing processes, low productivity, and an excessively large distance between SD and the flexible substrate in the existing display panel, which is not conducive to the bending issues in the bending region.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing an array substrate, wherein the array substrate comprises:
    a substrate;
        a semiconductor component, wherein the semiconductor component is formed on the substrate;
        a first insulating layer, wherein the first insulating layer covers the semiconductor component;
        a gate, wherein the gate is formed on the first insulating layer;
        a second insulating layer, wherein the second insulating layer covers the gate;
        an interlayer dielectric layer, wherein the interlayer dielectric layer covers the second insulating layer;
        a source, wherein at least a portion of the source is filled into a first via hole, and the source is electrically connected to the semiconductor component;
        a drain, wherein at least a portion of the drain is filled into a second via hole, and the drain is electrically connected to the semiconductor component;
        a barrier component, wherein the barrier component is formed on a same level layer as the semiconductor component, and the barrier component and the semiconductor component comprise a same material;
    a metal component, wherein at least a portion of the metal component is filled into a groove; and
    a planarization layer, wherein the planarization layer is disposed on the interlayer dielectric layer and covers the groove; and
    wherein the first via hole and the second via hole are formed in a display area of the array substrate, a bottom of the first via hole and a bottom of the second via hole are connected to the semiconductor component, the groove is formed in the bending area of the array substrate, and the barrier component is formed in the bending area, and
    wherein the groove comprises a first groove and a second groove, an opening of the second groove is formed at a bottom of the first groove, and the barrier component is formed at a bottom of the first groove and exposes the opening of the second groove,
    wherein the method comprises steps as follows:
    step A: forming the semiconductor component, the barrier component, the first insulating layer, the gate, the second insulating layer, and the interlayer dielectric layer on the array substrate in order;
    step B: performing a photolithographic process on the first insulating layer, the gate, the second insulating layer, and the interlayer dielectric layer with a predetermined mask; forming the first via hole, the second via hole, and the groove on the first insulating layer, the gate, the second insulating layer, and the interlayer dielectric layer by etching;
    step C: forming a metal layer in the first via hole, the second via hole, and the groove, wherein the source, the drain, and the metal component are formed by the metal layer; and
    step D: forming the planarization layer, wherein the planarization layer is disposed on the interlayer dielectric layer and covers the groove.

2. The method of manufacturing the array substrate according to claim 1, wherein the barrier component is formed during forming the semiconductor component component or the gate.

3. The method of manufacturing the array substrate according to claim 2, wherein the step A comprises:
    forming a semiconductor material layer on the substrate;
    patterning the semiconductor material layer to form the semiconductor component and the barrier component; and
    forming the first insulating layer, the gate, the second insulating layer, and the interlayer dielectric layer on the semiconductor component in order.

4. The method of manufacturing the array substrate according to claim 3, wherein a thickness of the barrier component before etching is equal or similar to the thickness of the semiconductor component, and a thickness of the barrier component after etching is less than a thickness of the semiconductor component.

5. The method of manufacturing the array substrate according to claim 1,
    wherein the step B comprises:
    performing a first photolithographic process and an etching on the substrate, the semiconductor component, the first insulating layer, the gate, the second insulating layer, and a portion of the interlayer dielectric layer corresponding to the bending area to form the first groove through the predetermined mask; and
    performing a second photolithographic process and an etching on the substrate, the semiconductor component, the first insulating layer, the gate, the second insulating layer, and a portion of the interlayer dielectric layer corresponding to the first groove to form the second groove through the predetermined mask and the barrier component.

6. The method of manufacturing the array substrate according to claim 1, wherein at least a portion of the metal component covers a sidewall of the first groove, the barrier component, and a sidewall and a bottom of the second groove.

7. An array substrate, comprising:
    a substrate;
    a semiconductor component, wherein the semiconductor component is formed on the substrate;
    a first insulating layer, wherein the first insulating layer covers the semiconductor component;
    a gate, wherein the gate is formed on the first insulating layer;
    a second insulating layer, wherein the second insulating layer covers the gate;
    an interlayer dielectric layer, wherein the interlayer dielectric layer covers the second insulating layer;
    a source, wherein at least a portion of the source is filled into a first via hole, and the source is electrically connected to the semiconductor component;
    a drain, wherein at least a portion of the drain is filled into a second via hole, and the drain is electrically connected to the semiconductor component;
    a barrier component, wherein the barrier component is formed on a same level layer as the semiconductor component, and the barrier component and the semiconductor component comprise a same material;

a metal component, wherein at least a portion of the metal component is filled into a groove; and a planarization layer, wherein the planarization layer is disposed on the interlayer dielectric layer and covers the groove; and wherein the first via hole and the second via hole are formed in a display area of the array substrate, a bottom of the first via hole and a bottom of the second via hole are connected to the semiconductor component, the groove is formed in the bending area of the array substrate, and the barrier component is formed in the bending area, and wherein the groove comprises a first groove and a second groove, an opening of the second groove is formed at a bottom of the first groove, and the barrier component is formed at a bottom of the first groove and exposes the opening of the second groove.

8. The array substrate according to claim 7, wherein the barrier component is formed during forming the semiconductor component.

9. The array substrate according to claim 8, wherein a thickness of the barrier component is less than a thickness of the semiconductor component.

10. The array substrate according to claim 7, wherein at least a portion of the metal component covers a sidewall of the first groove, the barrier component, and a sidewall and a bottom of the second groove.

11. The array substrate according to claim 7, wherein the substrate comprises a first flexible substrate, a silicon dioxide layer, a second flexible substrate, a barrier layer, and a buffer layer.

12. A display panel, comprising: an array substrate, a pixel definition layer, an anode, an organic light emitting layer, a cathode, and a packaging layer, wherein the array substrate comprises:
   a substrate;
   a semiconductor component, wherein the semiconductor component is formed on the substrate;
   a first insulating layer, wherein the first insulating layer covers the semiconductor component;
   a gate, wherein the gate is formed on the first insulating layer;
   a second insulating layer, wherein the second insulating layer covers the gate;
   an interlayer dielectric layer, wherein the interlayer dielectric layer covers the second insulating layer;
   a source, wherein at least a portion of the source is filled into a first via hole, and the source is electrically connected to the semiconductor component;
   a drain, wherein at least a portion of the drain is filled into a second via hole, and the drain is electrically connected to the semiconductor component;
   a barrier component, wherein the barrier component is formed on a same level layer as the semiconductor component, and the barrier component and the semiconductor component comprise a same material;
   a metal component, wherein at least a portion of the metal component is filled into a groove; and
   a planarization layer, wherein the planarization layer is disposed on the interlayer dielectric layer and covers the groove, and the pixel definition layer, the anode, the organic light emitting layer, the cathode, and the packaging layer are formed on the planarization layer in order; and wherein the first via hole and the second via hole are formed in the display area of the array substrate, a bottom of the first via hole and a bottom of the second via hole are connected to the semiconductor component, the groove is formed in the bending area of the array substrate, and the barrier component is formed in the bending area, and wherein the groove comprises a first groove and a second groove, an opening of the second groove is formed at a bottom of the first groove, and the barrier component is formed at a bottom of the first groove and exposes the opening of the second groove.

13. The display panel according to claim 12, wherein the barrier component is formed during forming the semiconductor component.

14. The display panel according to claim 13, wherein a thickness of the barrier component is less than a thickness of the semiconductor component.

15. The display panel according to claim 12, wherein at least a portion of the metal component covers a sidewall of the first groove, the barrier component, and a sidewall and a bottom of the second groove.

* * * * *